United States Patent
Lin

(10) Patent No.: US 7,465,622 B2
(45) Date of Patent: Dec. 16, 2008

(54) METHOD FOR MAKING A RAISED VERTICAL CHANNEL TRANSISTOR DEVICE

(75) Inventor: Shian-Jyh Lin, Chia-Yi Hsien (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 56 days.

(21) Appl. No.: 11/536,686

(22) Filed: Sep. 29, 2006

(65) Prior Publication Data

US 2008/0012066 A1    Jan. 17, 2008

(30) Foreign Application Priority Data

Jul. 14, 2006    (TW) ............................... 95125767 A

(51) Int. Cl.
*H01L 21/8238* (2006.01)

(52) U.S. Cl. ..................... 438/212; 438/206; 438/207; 438/209; 438/268; 438/269; 438/270; 438/271; 438/272; 438/273; 438/274; 257/328; 257/329; 257/330; 257/331; 257/332; 257/333; 257/334; 257/E21.418

(58) Field of Classification Search ......... 257/328–324, 257/E21.418, 329; 438/212, 206, 207, 209, 438/268–274
See application file for complete search history.

(56) References Cited

U.S. PATENT DOCUMENTS

| | | | | |
|---|---|---|---|---|
| 6,544,824 B1 * | 4/2003 | Pradeep et al. | .............. | 438/156 |
| 6,632,712 B1 * | 10/2003 | Ang et al. | .................... | 438/212 |
| 6,664,143 B2 * | 12/2003 | Zhang | ........................ | 438/138 |
| 6,815,307 B1 * | 11/2004 | Hsu et al. | .................... | 438/386 |
| 2002/0008280 A1 * | 1/2002 | Armacost et al. | ........... | 257/330 |
| 2003/0001203 A1 * | 1/2003 | Ono et al. | .................... | 257/330 |
| 2005/0029575 A1 * | 2/2005 | Chu et al. | .................... | 257/314 |
| 2007/0111414 A1 * | 5/2007 | Chaudhry et al. | ........... | 438/192 |
| 2008/0006874 A1 * | 1/2008 | Hadizad et al. | ............. | 257/328 |

* cited by examiner

*Primary Examiner*—Walter L Lindsay, Jr.
*Assistant Examiner*—Latanya Crawford
(74) *Attorney, Agent, or Firm*—Winston Hsu

(57) ABSTRACT

A method for fabricating a vertical channel transistor device is provided. An opening is formed in a dielectric stack comprised of a pad nitride layer and a pad oxide layer. A plurality of epitaxial silicon growth and dry etching processes are carried out to form drain, vertical channel and source in the opening. Subsequently, sidewall gate dielectric and sidewall gate electrode are formed on the vertical channel. The present invention is suited for dynamic random access memory (DRAM) devices, particularly suited for very high-density trench-capacitor DRAM devices.

11 Claims, 11 Drawing Sheets

METHOD FOR MAKING A RAISED VERTICAL CHANNEL TRANSISTOR DEVICE

BACKGROUND OF THE INVENTION

1. Field of the Invention

The present invention relates generally to a method for fabricating semiconductor transistor devices. More specifically, the present invention relates to a method for fabricating a vertical channel transistor device.

2. Description of the Prior Art

The planar transistor is often used as the basic devices in the semiconductor industry. In general, the so-called planar transistor has a gate channel parallel to a semiconductor substrate surface, and drain/source on the same surface of the semiconductor substrate in two sides of the gate channel. A gate dielectric layer is positioned on the gate channel, and usually a polycrystalline silicon gate is positioned on the gate dielectric layer. Furthermore, a spacer composed of dielectric materials is usually positioned on the sidewall of the polycrystalline silicon gate.

However, integrated circuit devices, especially the dynamic random access memory devices (DRAMs) are continually being made with higher device density, and since the conventional planar transistor requires more chip surface area, it does not fit in with the trend gradually. This problem can be temporarily resolved by shrinking the channel of the planar transistor, but it may result in leakage and short channel effect. Therefore, there is a strong need to provide an improved method for fabricating a transistor device in order to resolve the problems mentioned above.

SUMMARY OF THE INVENTION

It is a major object of this invention to provide a method for fabricating a vertical channel transistor device in order to solve the above-mentioned problems of the prior art.

According to the claimed invention, a method for fabricating a vertical channel transistor device comprising forming a pad layer on a semiconductor substrate, forming an opening in the pad layer and the semiconductor substrate, forming a first doped silicon layer inside the opening, wherein the first doped silicon layer has a first conductivity type, forming a second doped silicon layer on the first doped silicon layer, wherein the second doped silicon layer has a second conductivity type opposite to the first conductivity type, and top surface of the second doped silicon layer is lower than top surface of the pad layer, forming a first spacer on the pad layer, using the first spacer as an etching mask to etch the second doped silicon layer and the first doped silicon layer to expose the semiconductor substrate, forming a second spacer covering the first spacer, the second doped silicon layer, and the first doped silicon layer, forming a third doped silicon layer on the semiconductor substrate, wherein the third doped silicon layer has the second conductivity type, removing the second spacer to expose a portion of the second doped silicon layer, forming a fourth doped silicon layer on the third doped silicon layer, wherein the fourth doped silicon layer has the second conductivity type, forming a fifth doped silicon layer on the fourth doped silicon layer, wherein the fifth doped silicon layer has the first conductivity type, removing the pad layer, performing an ion implantation process to form a drain extension in the semiconductor substrate, forming a gate dielectric layer on the second doped silicon layer, and forming a sidewall gate on the gate dielectric layer and the first spacer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
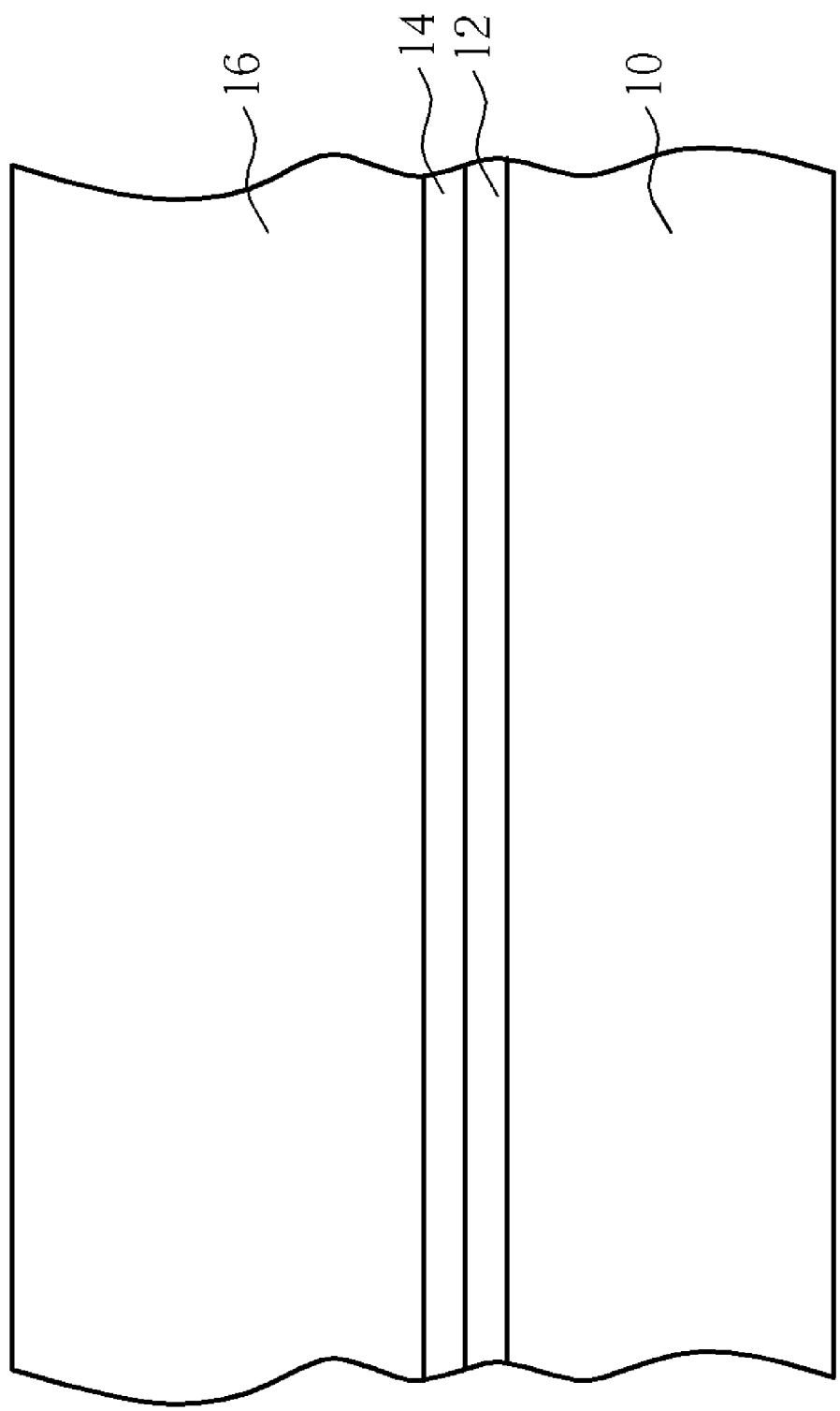
FIGS. 1-11 are schematic, cross-sectional diagrams illustrating a method for fabricating a vertical channel transistor device in accordance with one preferred embodiment of this invention.

Please refer to FIGS. 1-11. FIGS. 1-11 are schematic, cross-sectional diagrams illustrating a method for fabricating a vertical channel transistor device in accordance with one preferred embodiment of this invention. As shown in FIG. 1, a semiconductor substrate 10 such as a silicon substrate is provided. A buffer nitride layer 12 is then deposited on the semiconductor substrate 10. A pad oxide layer 14 is then deposited on the buffer nitride layer 12. A pad nitride layer 16 is then deposited on the pad oxide layer 14.

The buffer nitride layer 12 has a thickness of about 50 to 500 angstroms. The pad oxide layer 14 has a thickness of about 50 to 500 angstroms. The pad nitride layer 16 has a thickness of about 100 to 500 angstroms, and the thickness can be adjusted according to the channel length of the required transistor.

Figure 2:
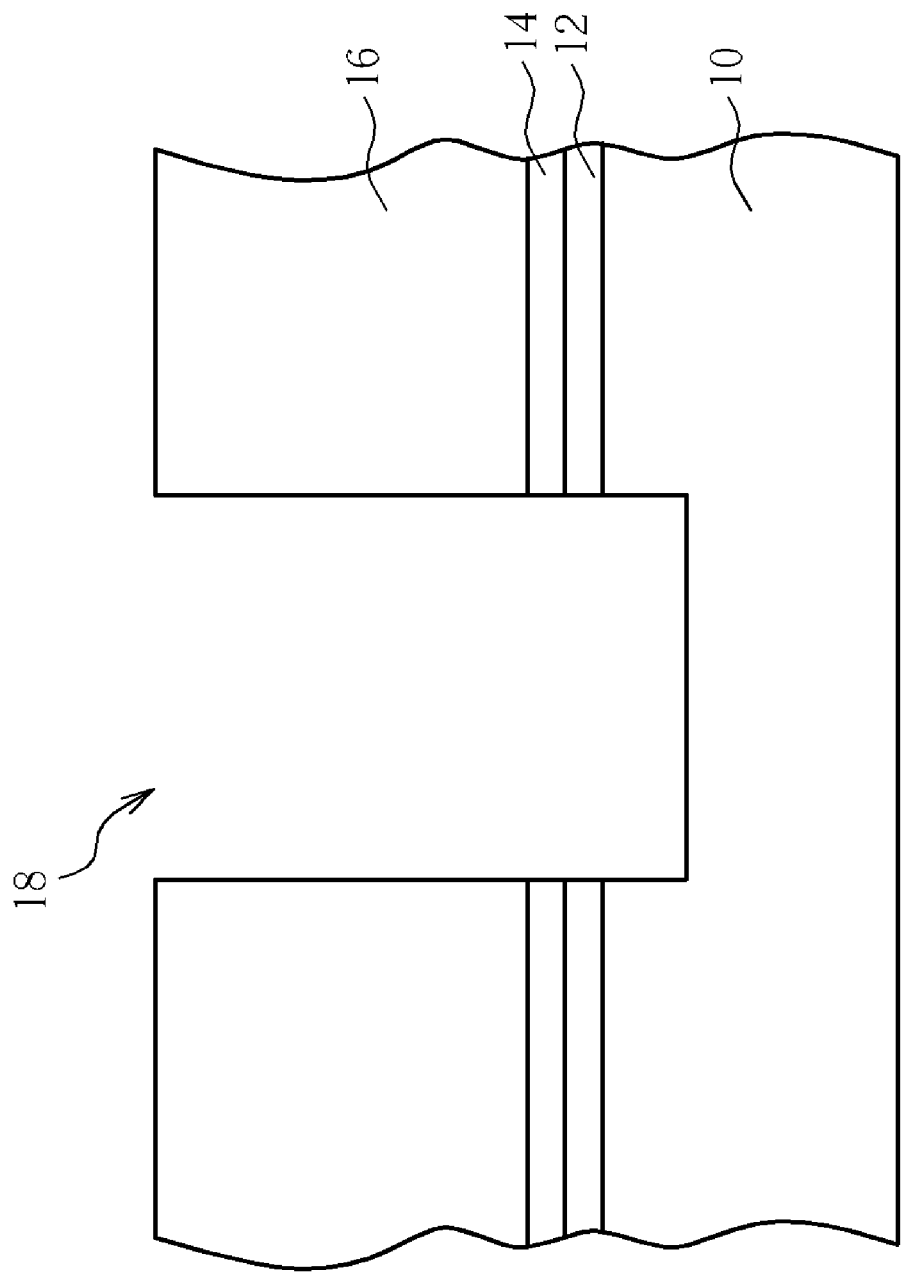

As shown in FIG. 2, a lithographic process and dry etching process are carried out to etch and form an opening 18 in the pad nitride layer 16, the pad oxide layer 14, the buffer nitride layer 12, and the semiconductor substrate 10.

Figure 3:
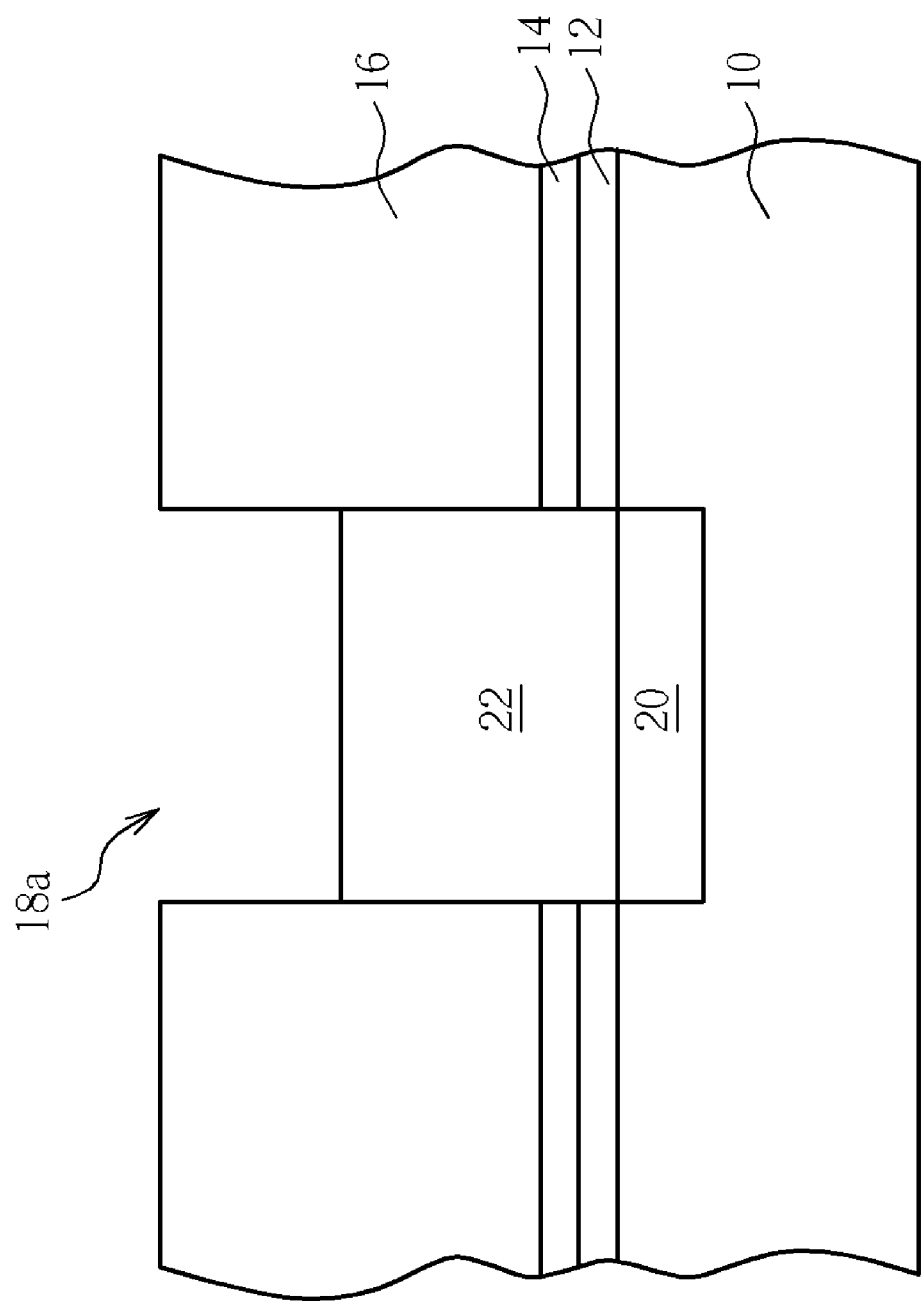

As shown in FIG. 3, an epitaxial silicon growth process is carried out to grow a doped epitaxial silicon layer 20 from the exposed semiconductor substrate 10 at the bottom of the opening 18. The thickness of the doped epitaxial silicon layer 20 is approximately equal to the removed thickness of the semiconductor substrate 10 inside the opening 18. Therefore, in this case, after the doped epitaxial silicon layer 20 is grown, the top surface of the doped epitaxial silicon layer 20 is approximately coplanar with the top surface of the semiconductor substrate 10, but is not limited to this.

In addition, according to the preferred embodiment of this invention, the doped epitaxial silicon layer 20 is doped with N+ dopants such as phosphorous, arsenic or antimony.

Next, a second epitaxial silicon growth process is carried out to grow a doped epitaxial silicon layer 22 on the doped epitaxial silicon layer 20, and the thickness of the doped epitaxial silicon layer 20 is approximately equal to the channel length of the vertical channel transistor in this invention. The conductivity type of the doped epitaxial silicon layer 22 is opposite to the doped epitaxial silicon layer 20.

According to the preferred embodiment of this invention, the doped epitaxial silicon layer 22 is doped with P dopants such as boron, and the doped epitaxial silicon layer 22 has a thickness of about 100 to 3000 angstroms, and the thickness can be adjusted according to the channel length of the required transistor. In the meantime, the top surface of the doped epitaxial silicon layer 22 and the pad nitride layer 16 form a recessed area 18a.

Figure 4:
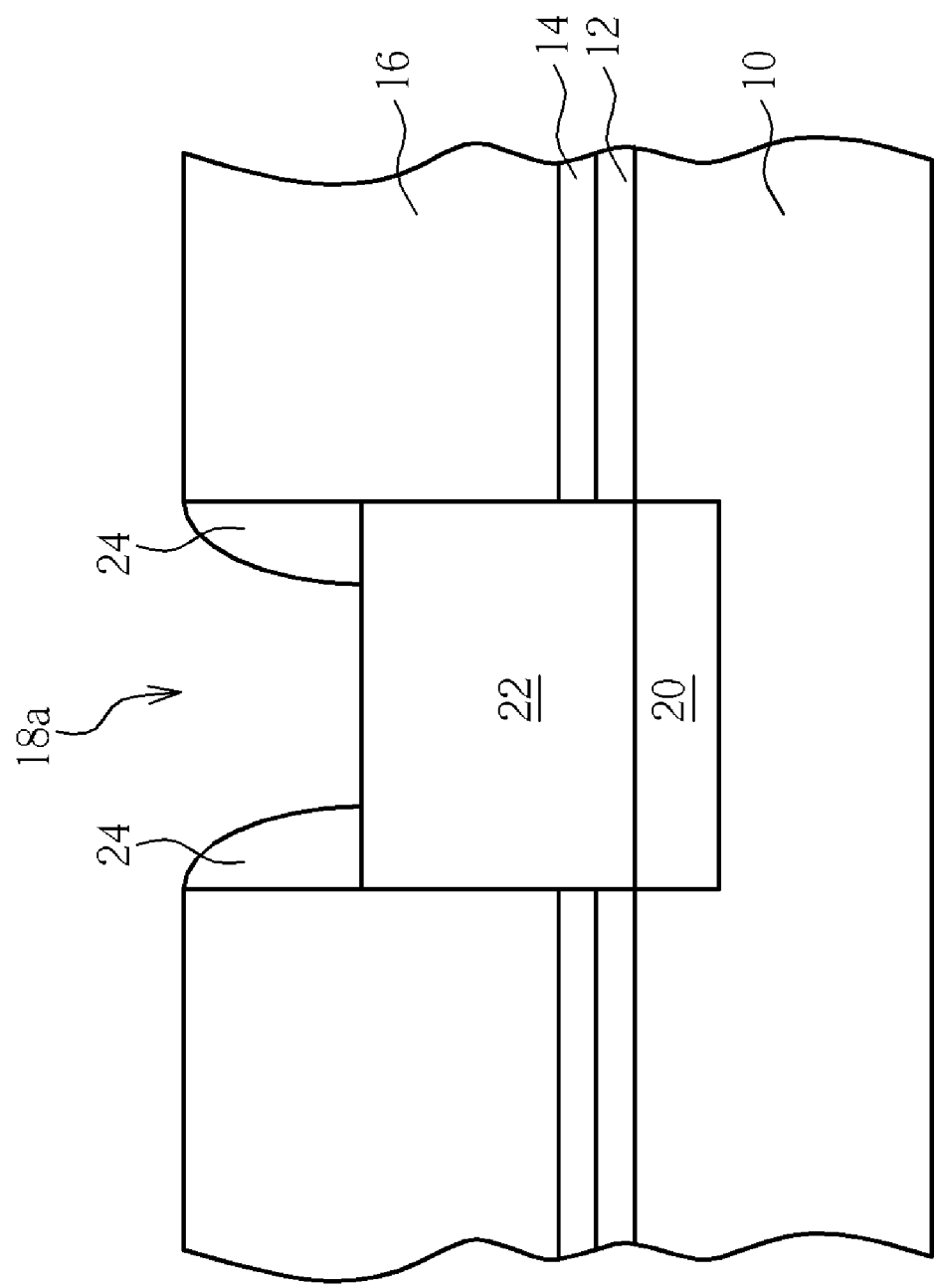

As shown in FIG. 4, a silicon oxide spacer 24 is formed on the sidewall inside the recessed area 18a to expose a portion of the top surface of doped epitaxial silicon layer 22 inside the recessed area 18a.

Figure 5:
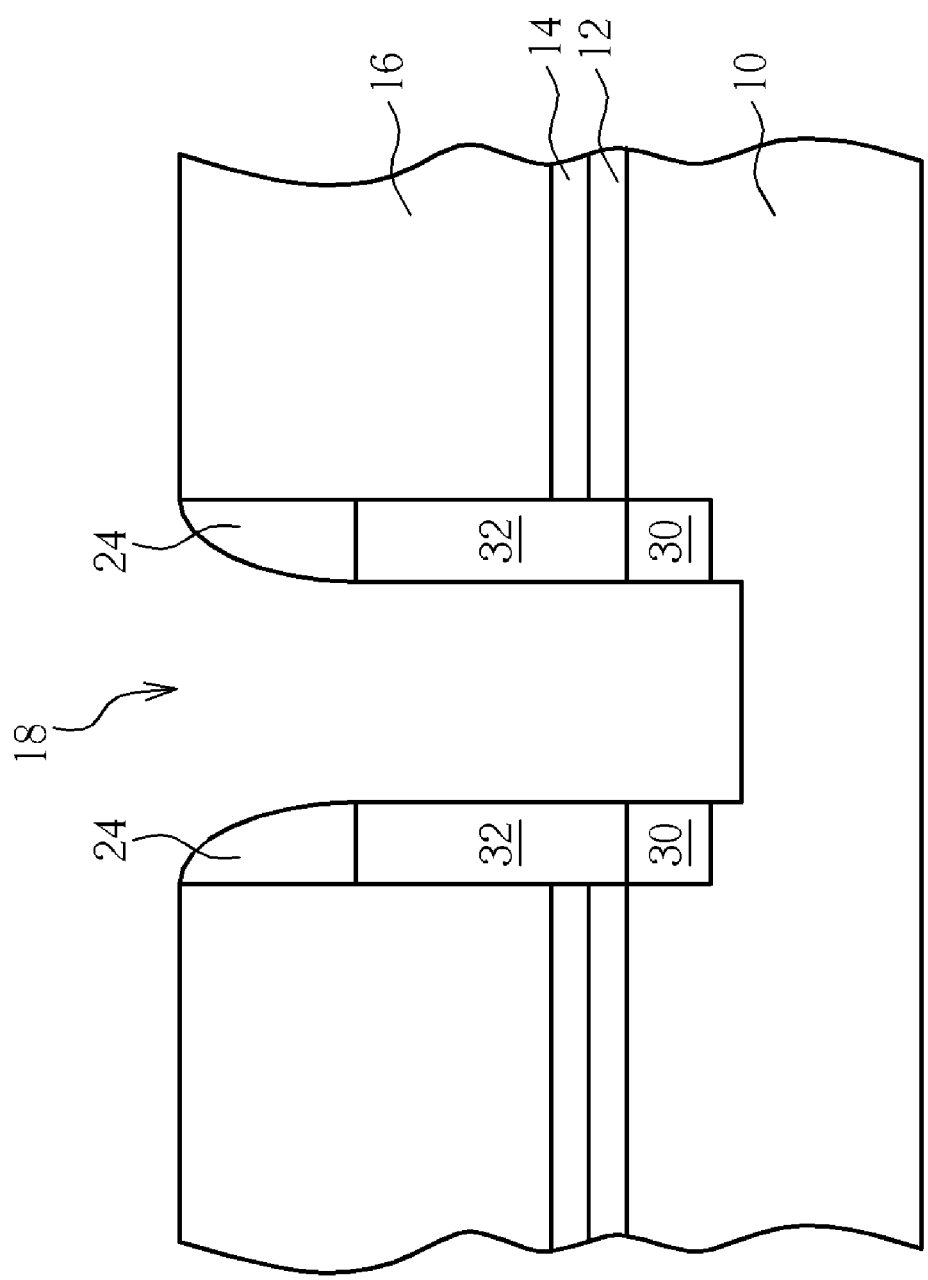

As shown in FIG. 5, a dry etching process is then carried out to etch the exposed doped epitaxial silicon layer 22 inside the recessed area 18a, and etch through the doped epitaxial silicon layer 20 until the semiconductor substrate 10 is exposed by using the silicon oxide spacer 24 and the pad nitride layer 16 as a hard mask. A drain 30 and a vertical channel 32 are formed together after the dry etching process.

Figure 6:
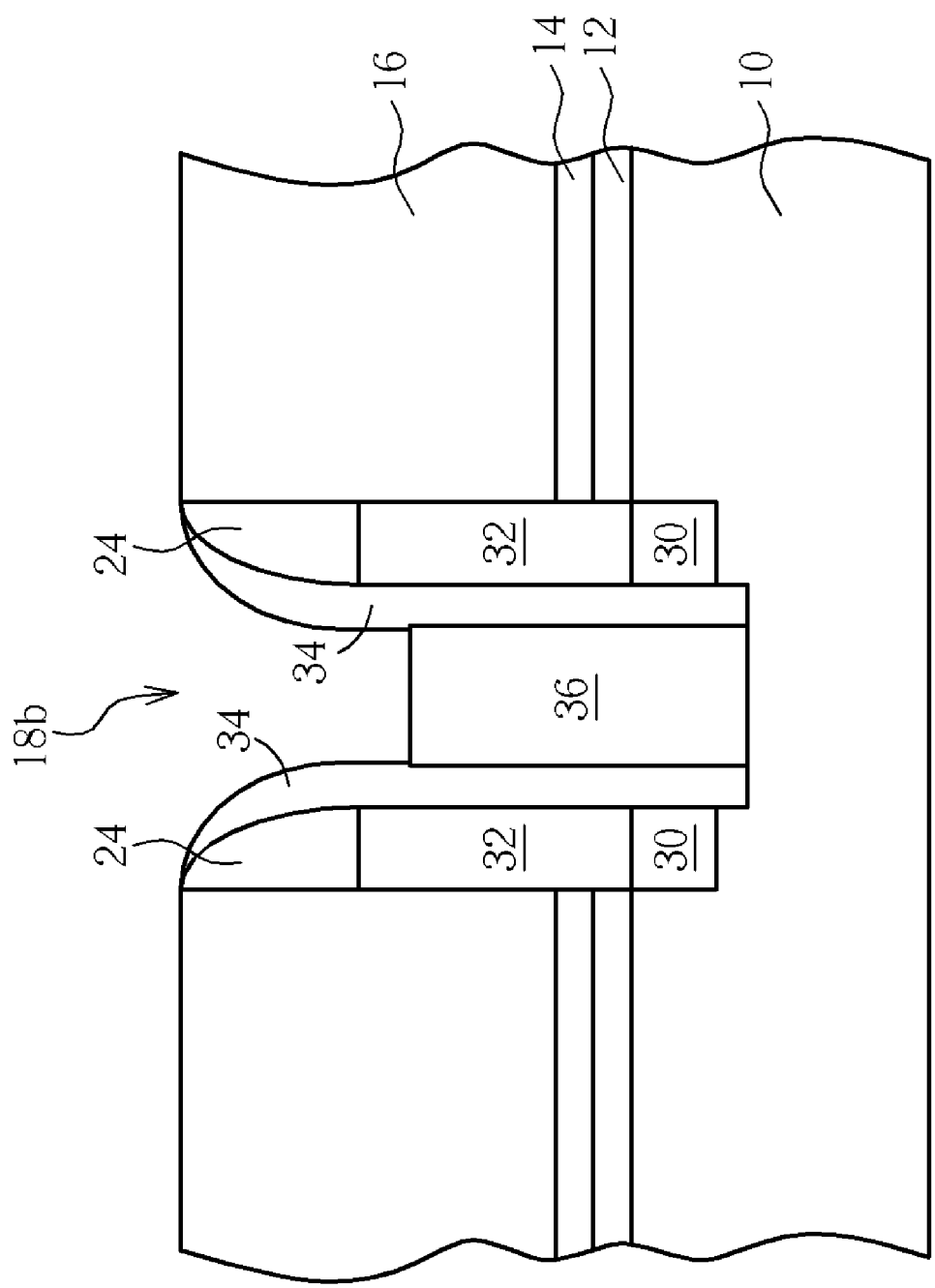

As shown in FIG. 6, a silicon oxide spacer 34 is formed inside the opening 18 and covering the silicon oxide spacer 24, the drain 30, and the vertical channel 32. The silicon oxide spacer 34 is formed using a chemical vapor deposition (CVD) process to deposit a silicon oxide layer on the sidewall inside the opening 18, and then an anisotropic dry etch process is carried out to etch the silicon oxide layer until the semiconductor substrate 10 is exposed.

Next, according to the preferred embodiment of this invention, a third epitaxial silicon growth process is carried out to grow a doped epitaxial silicon layer 36 on the exposed semiconductor substrate 10. The top surface of the doped epitaxial silicon layer 36 is required to be lower than top edge of the vertical channel 32.

The doped epitaxial silicon layer 36 has the same conductivity type as the vertical channel 32. The top surface of the doped epitaxial silicon layer 36 and the silicon oxide spacer 34 define a recessed area 18b.

Figure 7:
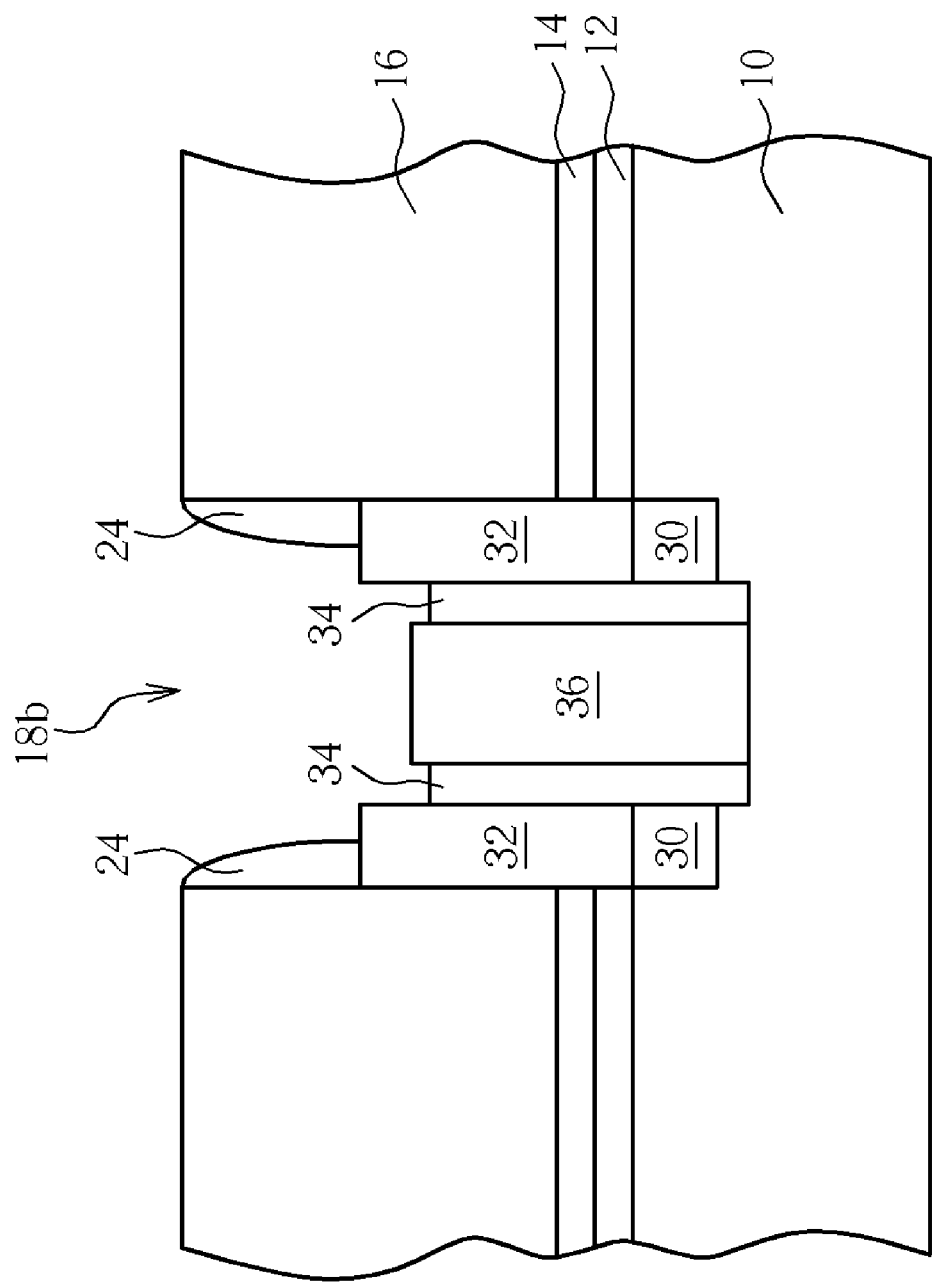

As shown in FIG. 7, an etching process such as a wet etching process is carried out to etch and remove the silicon oxide spacer 34 uncovered by the doped epitaxial silicon layer 36 from the recessed area 18b, and a portion of the vertical channel 32 is exposed.

Figure 8:
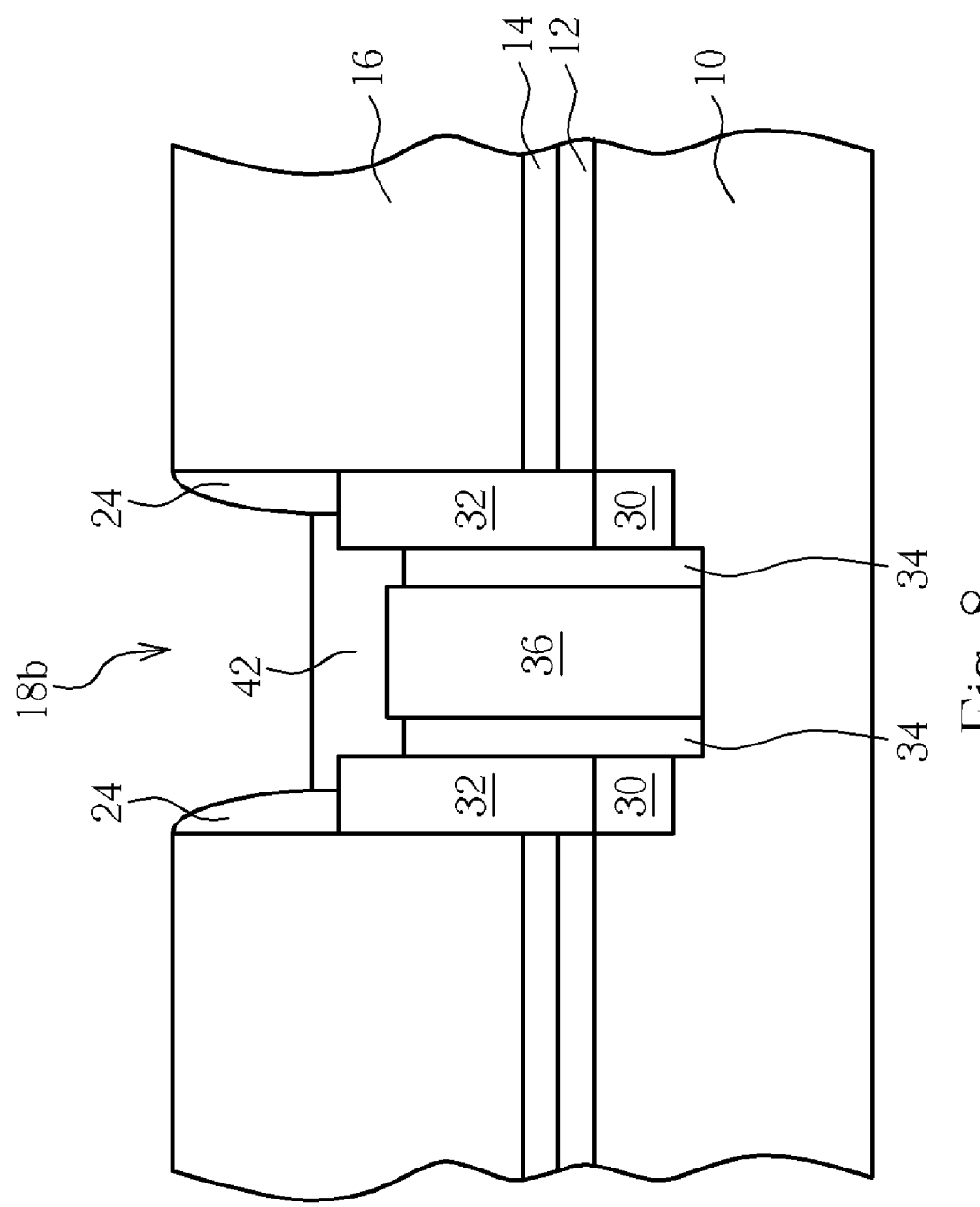

As shown in FIG. 8, a fourth epitaxial silicon growth process is carried out to grow a doped epitaxial silicon layer 42 on the exposed doped epitaxial silicon layer 36 and the vertical channel 32, wherein the doped epitaxial silicon layer 42 has the same conductivity type as the vertical channel 32, and the conductivity type is P type according to the preferred embodiment of this invention. The doped epitaxial silicon layer 42 can be replaced with a P type doped polycrystalline silicon layer.

Figure 9:
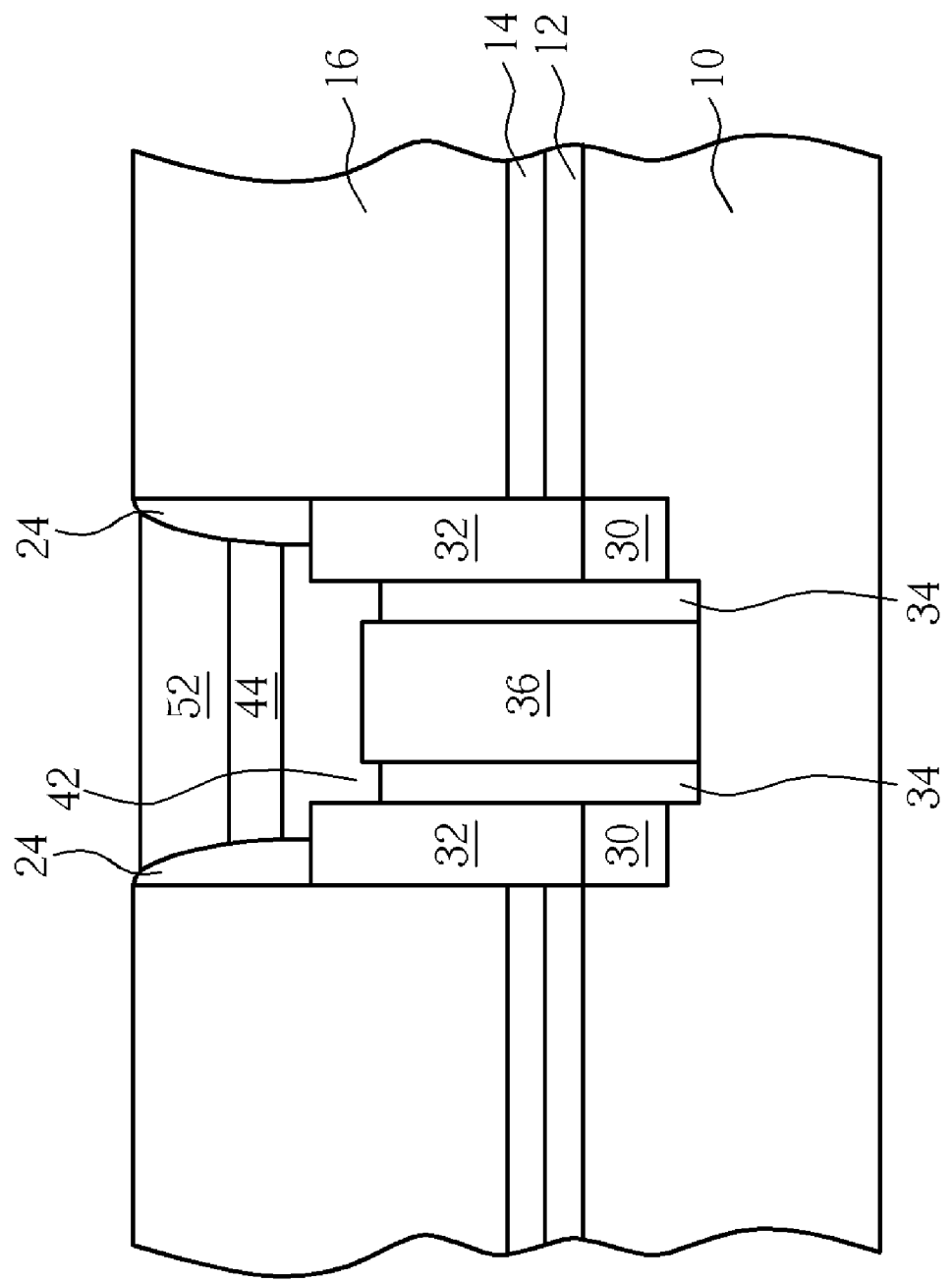

As shown in FIG. 9, a fifth epitaxial silicon growth process is carried out to grow a doped epitaxial silicon layer 44 on the doped epitaxial silicon layer 42, wherein the doped epitaxial silicon layer 44 has an opposite conductivity type to the vertical channel 32, and the conductivity type of the doped epitaxial silicon layer 44 is N type according to the preferred embodiment of this invention. Furthermore, the doped epitaxial silicon layer 44 can be replaced with an N type doped polycrystalline silicon layer.

According to the preferred embodiment of this invention, the dopants of the doped epitaxial silicon layer 44 may diffuse to the vertical channel 32. The doped epitaxial silicon layer 44 is used as a source of the vertical channel transistor in this invention.

Next, a CVD process is carried out to deposit a silicon oxide layer 52, and then a chemical mechanical polishing (CMP) process is carried out using the pad nitride layer 16 as a polishing stop layer to cover the doped epitaxial silicon layer 44 with the remnant silicon oxide layer 52.

Figure 10:
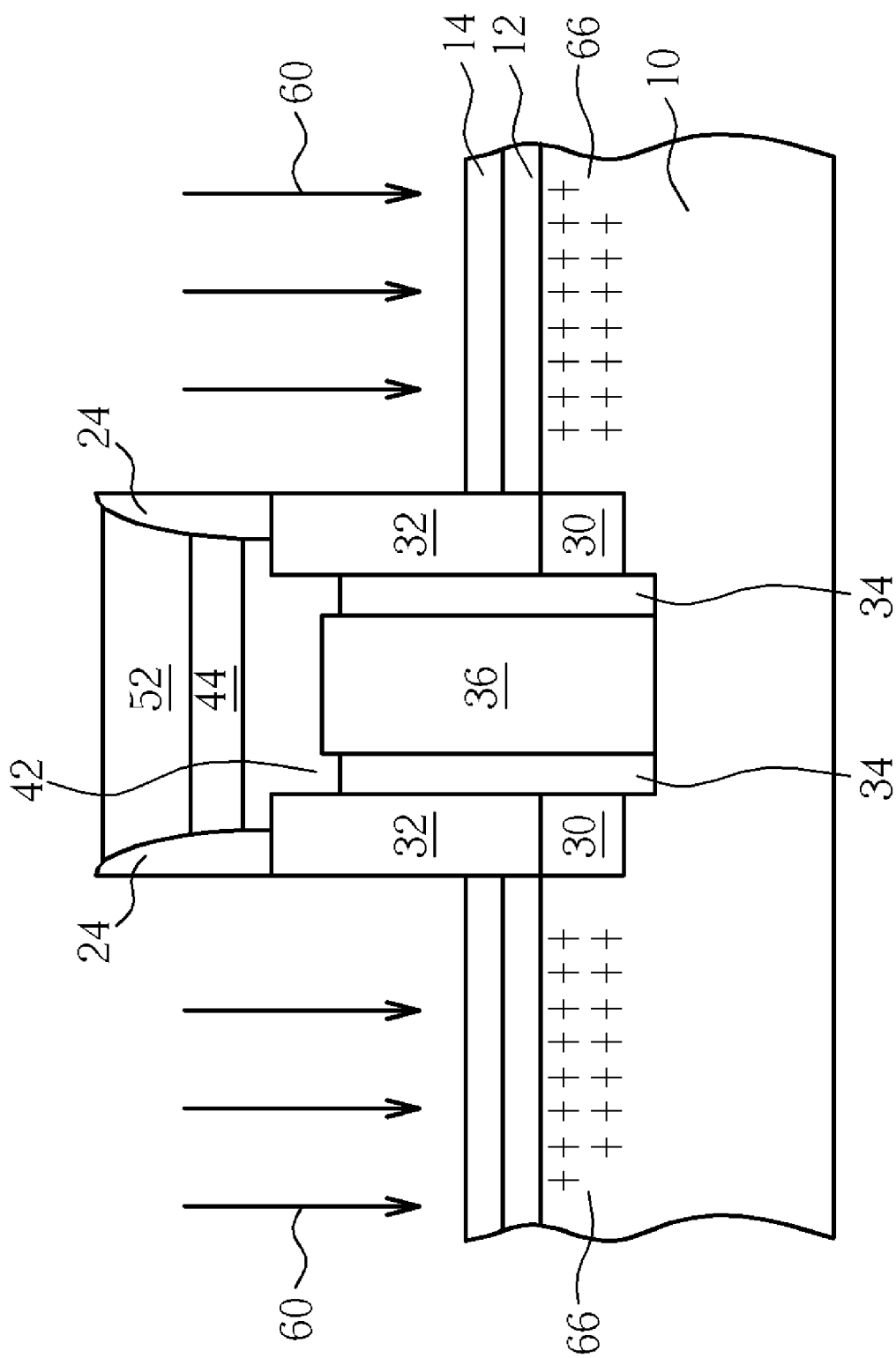

As shown in FIG. 10, the pad nitride layer 16 is then stripped off by using methods known in the art, for example, wet etching solution such as heated phosphorus acid dipping, and the pad oxide layer 14 and the vertical channel 32 are exposed.

An ion implantation process 60 using the silicon oxide layer 52 and the silicon oxide spacer 24 as ion implantation mask is carried out to implant the dopants such as phosphorous, arsenic, or antimony into the semiconductor substrate 10 in order to form an N type doped area 66 as a drain extension, wherein the drain extension borders the drain 30.

After finishing the ion implantation process of the N type doped area, an oxidation process is carried out to form a sacrificing oxide layer (not shown), and then another ion implantation process such as a tilt-angle ion implantation process is carried out to adjust the threshold voltages of the vertical channel 32.

After adjusting the threshold voltages of the vertical channel 32, a wet etching process is carried out to strip the sacrificing oxide layer and the pad oxide layer 14 to expose the vertical channel 32.

Figure 11:
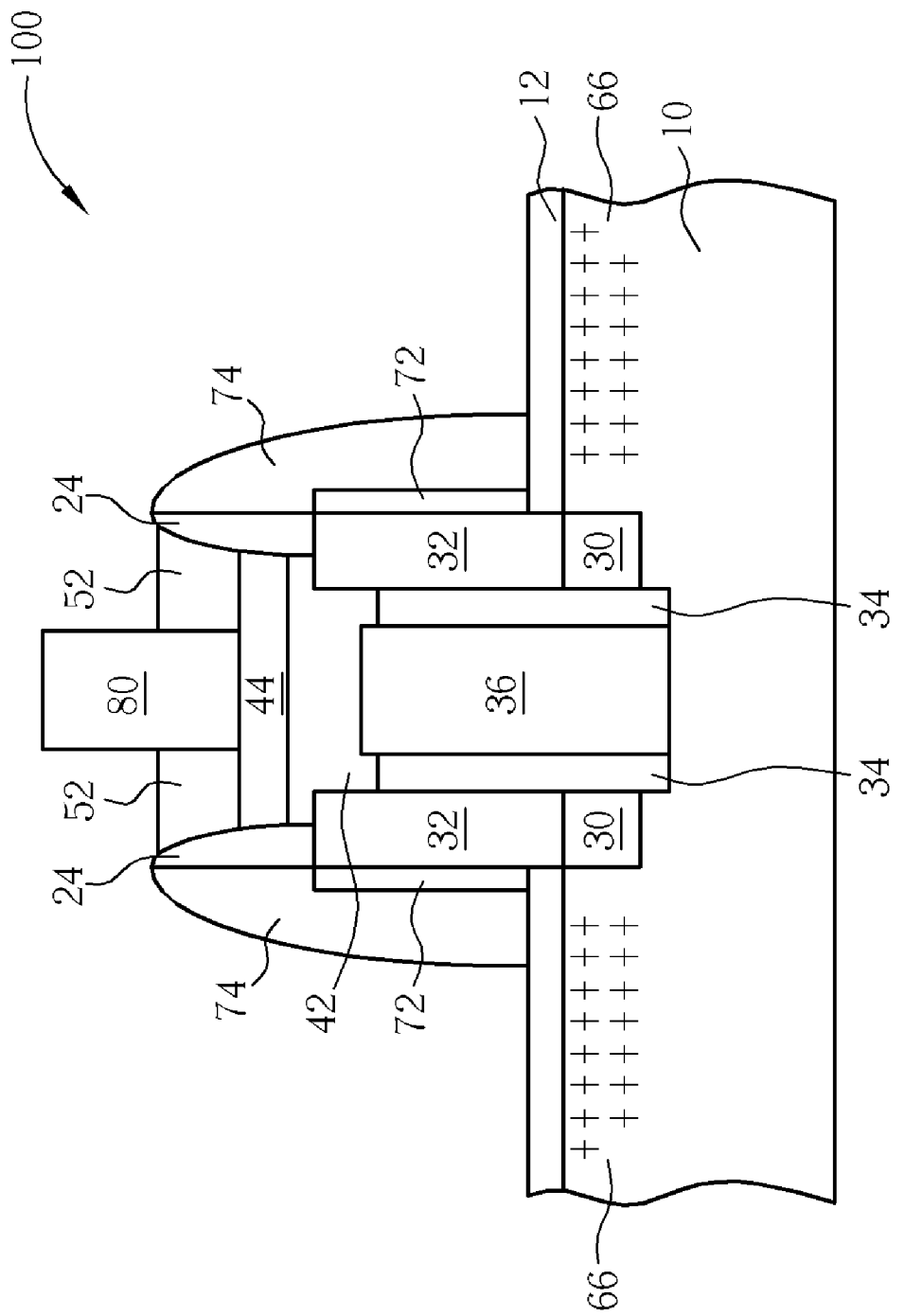

Next, as shown in FIG. 11, a high quality gate dielectric layer 72 is formed on the exposed vertical channel 32 using a dry oxidation process, wet oxidation process, in-situ steam growth process, or an atomic layer deposition process.

A sidewall gate 74 is then formed on the vertical channel 32, and the vertical channel transistor 100 of the present invention is completed.

According to the preferred embodiment of this invention, the sidewall gate 74 may be formed by depositing a polycrystalline silicon layer on the semiconductor substrate 10 first, and then anisotropic etching the polycrystalline silicon layer. In addition, a conducting plug 80 can be formed to electrically connect the source 44 of the vertical channel transistor 100 of the present invention.

The vertical channel transistor of the present invention has dual vertical channels, and short channel effects can be avoided by controlling the vertical channel length via the epitaxial silicon growth process. The method of the present invention is applicable to the DRAM processes, especially the process of the high-density trench DRAMs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a vertical channel transistor device comprising:

forming a pad layer on a semiconductor substrate;

forming an opening in the pad layer and the semiconductor substrate;

forming a first doped silicon layer inside the opening, wherein the first doped silicon layer has a first conductivity type;

forming a second doped silicon layer on the first doped silicon layer, wherein the second doped silicon layer has a second conductivity type and a top surface lower than a top surface of the pad layer;

forming a first spacer on the pad layer and partially exposing the second doped silicon layer;

removing the exposed second doped silicon layer and a portion of the first doped silicon layer to partially expose the semiconductor substrate;

forming a second spacer covering the first spacer, the second doped silicon layer, and the first doped silicon layer;

forming a third doped silicon layer on the exposed semiconductor substrate, wherein the third doped silicon layer has the second conductivity type;

partially removing the second spacer to partially expose the second doped silicon layer;

forming a fourth doped silicon layer on the third doped silicon layer and connecting with the second doped silicon layer in the opening, wherein the fourth doped silicon layer has the second conductivity type;

forming a fifth doped silicon layer on the fourth doped silicon layer in the opening, wherein the fifth doped silicon layer has the first conductivity type;

removing the pad layer;

performing an ion implantation process to form a drain extension in the semiconductor substrate;

forming a gate dielectric layer on a sidewall of the second doped silicon layer; and forming a sidewall gate covering the gate dielectric layer and on a sidewall of the first spacer such that the vertical channel transistor device is fabricated.

2. The method of claim 1 wherein the pad layer is a nitride layer.

3. The method of claim 1 wherein the first spacer is a silicon oxide spacer.

4. The method of claim 1 wherein the second spacer is a silicon oxide spacer.

5. The method of claim 1 wherein the first conductivity type is N type.

6. The method of claim 5 wherein the second conductivity type is P type.

7. The method of claim 1 wherein the drain extension has the first conductivity type.

8. The method of claim 1 wherein the sidewall gate is formed by depositing a polycrystalline silicon layer on the semiconductor substrate first, and then anisotropic etching the polycrystalline silicon layer.

9. The method of claim 1 wherein the gate dielectric layer is formed by using a dry oxidation process, wet oxidation process, or in-situ steam growth process.

10. The method of claim 1 wherein the gate dielectric layer is formed by using an atomic layer deposition process.

11. The method of claim 1 wherein before stripping the pad layer, the method farther comprising:

depositing a silicon oxide layer on the semiconductor substrate, and the silicon oxide layer covering the fifth doped silicon layer; and performing a chemical mechanical polishing process to planarize the silicon oxide layer using the pad layer as a polishing stop layer.

* * * * *